United States Patent [19]

Sato

[11] 4,233,505
[45] Nov. 11, 1980

[54] LIGHT RECEIVING CIRCUIT HAVING FAST RESPONSE TIME AND A STABLE OUTPUT WAVEFORM

[75] Inventor: Reisuke Sato, Kawagoe, Japan

[73] Assignee: Pioneer Electronic Corporation, Tokyo, Japan

[21] Appl. No.: 933,379

[22] Filed: Aug. 14, 1978

[30] Foreign Application Priority Data

Aug. 24, 1977 [JP] Japan .................................. 52/101249

[51] Int. Cl.³ .............................................. H01J 40/14
[52] U.S. Cl. .................................... 250/214 R; 250/209
[58] Field of Search ............. 250/209, 214 R, 231 SE, 250/551; 307/311

[56] References Cited

U.S. PATENT DOCUMENTS

| | | | |
|---|---|---|---|
| 3,424,908 | 1/1969 | Sitter | 307/311 |
| 3,450,888 | 6/1969 | Spangler | 250/214 R |
| 3,535,529 | 10/1970 | Davidson | 250/214 R |
| 3,786,264 | 1/1974 | Ferro et al. | 250/214 R |
| 3,814,944 | 6/1974 | Berger | 250/214 R |
| 3,881,118 | 4/1975 | Forrest et al. | 307/311 |

*Primary Examiner*—David C. Nelms
*Attorney, Agent, or Firm*—Sughrue, Rothwell, Mion, Zinn and Macpeak

[57] ABSTRACT

The present invention is a light receiving circuit which includes an active device and light responsive switching device. The active device has an emitter, a base and a collector, the base being responsive to a first constant voltage source and the collector being responsive to a second voltage source. The light responsive switching device has a first lead and a second lead, the first lead being connected electrical ground and the second lead being connected to the emitter of the active device. The light receiving circuit of the present invention exhibits a high response speed and a stable output waveform. In another embodiment, the light receiving circuit of the present invention includes two active devices and two light responsive switching devices.

5 Claims, 3 Drawing Figures

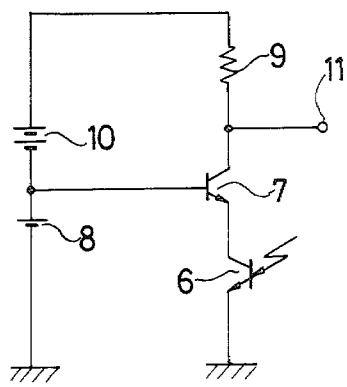
F I G. 2
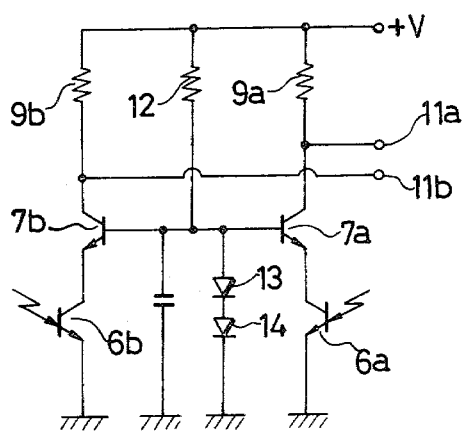
F I G. 3

LIGHT RECEIVING CIRCUIT HAVING FAST RESPONSE TIME AND A STABLE OUTPUT WAVEFORM

BACKGROUND OF THE INVENTION

1. Field of the Invention

The present invention relates generally to a light receiving circuit for use in a tuning pulse generator of an electronic tuning type receiver, and more particularly, to a light receiving circuit having a high response speed and minimal output fluctuation for use in a tuning pulse generator of an electronic tuning type receiver.

2. Description of the Prior Art

As a result of rapid progress in electronic technology, receivers have been extensively improved. Recently, an electronic tuning system has been employed in a receiver. Such an electronic tuning system includes a pulse generator for generating up-pulses or down-pulses in accordance with manual operation by the user. The pulse output from the pulse generator is counted by an up-down counter, which provides a digital bit stream output. The output digital bit stream is then converted to an analog signal in the form of a station selection voltage, which is applied to a variable capacitance diode (varactor diode) in the tuning section thereby to achieve the desired station selection.

In this pulse generator, a disk having a number of slits is rotated in association with a station selecting knob so as to be operated similarly to the conventional variable tuning capacitor. Light passed through a slit in the disk is received by two light receiving elements, e.g., photodiodes, which are positioned in the rotation direction of the disk slightly apart from each other. From the relationship between the outputs of the two light receiving elements, up-pulses, down-pulses and clock pulses are obtained.

The conventional light receiving circuit employed for each of the two light receiving elements is shown in FIG. 1.

Referring to FIG. 1, the emitter of a photo-transistor 1 is grounded, and the collector thereof is connected through a resistor 2 to a power supply +B. A transistor 3 receives as its base input the voltage present at the connection point P of the photo-transistor 1 and the resistor 2. The emitter of transistor 3 is grounded, and the collector thereof is connected through a resistor 4 to the power supply +B. An output terminal 5 is connected to the collector of the transistor 3.

When the photo-transistor 1 receives light, the resistance value of the photo-transistor 1 is varied in accordance with the intensity of the light, as a result of which the voltage level at connection point P is correspondingly varied. The voltage at connection point P is applied to the base of the transistor 3, and is amplified by transistor 3. The amplified light receiving signal appears on the output terminal 5.

However, the conventional light receiving circuit described-above has deficiencies in that it has a slow response speed to the input light and its high or low level outputs fluctuate greatly.

SUMMARY OF THE INVENTION

The present invention is a light receiving circuit which includes an active device and a light responsive switching device. The active device has an emitter, a base and a collector, the base being responsive to a first constant voltage source and the collector being responsive to a second constant voltage source. The light responsive switching device has a first lead and a second lead, the first lead being connected to electrical ground and the second lead being connected to the emitter of the active device. The light receiving circuit of the present invention exhibits a high responsive speed and a stable output waveform.

In another embodiment, the light receiving circuit of the present invention includes two active devices and two light responsive switching devices. The first active device has an emitter, a base and a collector, the base being responsive to a first constant voltage source and the collector being responsive to a second constant voltage source. The second active device has an emitter, a base and a collector, the base being responsive to the first constant voltage source and the collector being responsive to a third constant voltage source. The first light responsive switching device has a first lead and a second lead, the first lead being connected to electrical ground and the second lead being connected to the emitter of the first active device. The second light responsive switching device has a first lead and a second lead, the first lead being connected to electrical ground and the second lead being connected to the emitter of the second active device. The second embodiment of the light receiving circuit of the present invention exhibits high responsive speeds and stable output waveforms.

BRIEF DESCRIPTION OF THE DRAWINGS

FIG. 2 is a circuit diagram of a first embodiment of a light receiving circuit of the present invention for use, for example, in a pulse generator tuning stage of an electronic tuning type receiver; and FIG. 3 is a circuit diagram of a second embodiment of a light receiving circuit of the present invention for use, for example, in a pulse generator tuning stage of an electronic tuning type receiver.

DETAILED DESCRIPTION OF THE INVENTION

Figure 1:
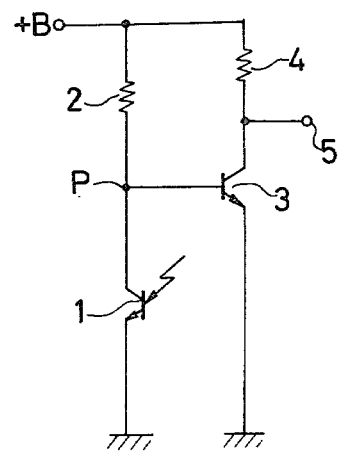
FIG. 1 is a circuit diagram of a conventional light receiving circuit.

The present invention is now described in detail with reference to FIGS. 2 and 3.

Turning now to FIG. 2, the basic embodiment of the light receiving circuit of the present invention is shown. The light receiving circuit of this embodiment includes a photo-transistor 6 having an emitter which is grounded. The collector of photo-transistor 6 is connected to the emitter of an amplifying transistor 7, the base of which is connected to the output of a first voltage source 8. The collector of the transistor 7 is connected through a resistor 9 to the positive terminal of a second voltage source 10, which is connected in series to the first voltage source 8. A voltage at the collector of transistor 7 is delivered at an output terminal 11, as a light reception output voltage.

When light passes through a slit of a tuning pulse generating device (not shown) and impinges on the detecting window of the photo-transistor 6 of FIG. 2, the resistance of the photo-transistor 6 is decreased in accordance with the intensity of the light, causing transistor 7 to be driven into the conductive or ON state instantaneously so as to provide a light reception output at a logical low (L) level to output terminal 11.

In this case, because the output of the first voltage source 8 is applied continuously to the base of the transistor 7, the response speed of transistor 7 is markedly increased when compared with the response speed of the conventional light receiving circuit of FIG. 1. In addition, because the voltage potential at the base of transistor 7 is maintained unchanged and is independent of the variations in resistance of the photo-transistor 6, the fluctuation in the light detection output signal is reduced considerably.

FIG. 3 shows the second embodiment of the present invention of FIG. 2 employed as a light receiving circuit for generating tuning pulses in an electronic tuning type receiver.

In the application shown in FIG. 3, two of the light receiving circuits of FIG. 2 are juxtaposed. A voltage source +V is employed as the second electric source 10, while a voltage across diodes 13 and 14, which are connected through a resistor 12 between the voltage source +V and the ground, is employed as the first voltage source 8 and is applied to the bases of transistors 7a and 7b.

In this case, the circuit can be driven by only one voltage source. That is, two light receiving circuits thus juxtaposed can commonly use the voltage source. Accordingly, the circuit can be substantially simplified.

As is apparent from the above description, the light receiving circuit according to the present invention exhibits a very fast response time and a substantially improved detection output stability.

What is claimed is:

1. A light receiving dicruit, comprising:
   (a) an active device having an emitter, a base and a collector, a first constant voltage source continuously applied to said base, and a second constant voltage source continuously applied to said collector through a first resistance to thereby provide a continuous reverse bias at the junction of said collector and said base;
   (b) a light responsive switching device having a variable resistance and having a first lead and a second lead, said first lead connected to electrical ground and said second lead connected to said emitter of said active device;
   (c) whereby the bias voltage at the junction of said emitter and said base of said active device is a function of the value of said first resistance, said second voltage source and said variable resistance, and is forward biased when the level of light on said light responsive switching device reaches a predetermined level, said active device thereby conducting current through said first resistance, said active device and said light responsive device when said predetermined level is reached;
   (d) wherein said predetermined level produces a small change in said variable resistance of said light responsive switching device, and
   (e) whereby the magnitude of the voltage across said light responsive switching device need only drop from approximately the magnitude of said first constant voltage source to just below the magnitude of said first constant voltage source to cause said conduction of said active device.

2. The light receiving circuit as recited in claim 1, wherein said light responsive switching device is a photo-transistor having an emitter as said first lead and a collector as said second lead.

3. The light receiving circuit as recited in claim 1, wherein said light responsive switching device is a photodiode having a cathode as said first lead and an anode as said second lead.

4. The light receiving circuit as recited in claim 2, wherein said active device is a NPN transistor, wherein said first constant voltage source has a positive potential, wherein said second constant voltage source has a positive potential, and wherein said light responsive switching device is a NPN photo-transistor.

5. The light receiving circuit as recited in claim 2, wherein said active device is a PNP transistor, wherein said first constant voltage source has a negative potential, wherein said second constant voltage source has a negative potential, and wherein said light responsive switching device is a PNP photo-transistor.

* * * * *